United States Patent [19]

Tamura et al.

[11] Patent Number: 4,752,592
[45] Date of Patent: Jun. 21, 1988

[54] ANNEALING METHOD FOR COMPOUND SEMICONDUCTOR SUBSTRATE

[75] Inventors: Akiyoshi Tamura, Suita; Takeshi Onuma, Katano, both of Japan

[73] Assignee: Matsushita Electric Industrial Co., Ltd., Osaka, Japan

[21] Appl. No.: 935,827

[22] Filed: Nov. 28, 1986

[30] Foreign Application Priority Data

Nov. 29, 1985 [JP] Japan ................. 60-269706

[51] Int. Cl.$^4$ .......................... H01L 21/265
[52] U.S. Cl. .................. 437/247; 148/DIG. 4; 437/22; 437/942; 437/939
[58] Field of Search ............ 437/247, 22, 942, 939

[56] References Cited

U.S. PATENT DOCUMENTS

| | | | |
|---|---|---|---|
| 4,468,259 | 8/1984 | Mimura | 148/1.5 |
| 4,469,529 | 9/1984 | Mimura | 29/576 B |
| 4,482,393 | 11/1984 | Nishiyama et al. | 148/1.5 |
| 4,482,395 | 11/1984 | Hiramoto | 29/576 T |
| 4,504,323 | 3/1985 | Arai et al. | 29/576 T |
| 4,560,420 | 12/1985 | Lord | 148/1.5 |

FOREIGN PATENT DOCUMENTS

| | | | |
|---|---|---|---|
| 0006136 | 1/1983 | Japan | 148/DIG. 4 |
| 0037122 | 2/1985 | Japan | 148/DIG. 4 |
| 0037717 | 2/1985 | Japan | 148/DIG. 4 |
| 0239400 | 11/1985 | Japan | 148/DIG. 4 |

OTHER PUBLICATIONS

Badawi et al., Electronics Letts., 20, (1984), 125.
Cummings et al., Jour. Appl. Phys., 60, (1986), 163.
Hiramoto et al., Jap. Jour. Appl. Phys., 24, (1985), L-193.

*Primary Examiner*—Upendra Roy
*Attorney, Agent, or Firm*—Wenderoth, Lind & Ponack

[57] ABSTRACT

An annealing method for a GaAs wafer which uses incoherent light, e.g., infrared light generated from tungsten lamp, halogen lamp, etc. and a GaAs guard ring which surrounds the GaAs wafer. The thickness of the guard ring is 1.5 times more than that of the GaAs wafer, the internal diameter of the guard ring is less than diameter of GaAs wafer plus 3 mm and the width of the guard ring is less than 10 mm.

3 Claims, 7 Drawing Sheets

ANNEALING METHOD FOR COMPOUND SEMICONDUCTOR SUBSTRATE

BACKGROUND OF THE INVENTION

This invention relates to an annealing method for a compound semiconductor substrate and, more particularly to, an annealing method which is capable of effectively suppressing the slip line generation and offering uniform annealing characteristics for over two-inch diameter compound semiconductor wafers, e.g., GaAs wafers.

In respect to annealing methods for ion-implanted layers of a semiconductor substrate, there are two kinds of annealing methods from the viewpoint of annealing time. One is furnace annealing which uses a conventional electric furnace, and the other is annealing which uses incoherent light such as an infrared lamp, etc. The former method requires several minutes~several tens of minutes of annealing time whereas the latter method simply requires several seconds~several tens of seconds. In particular, the infrared lamp annealing is more advantageous than the conventional furnace annealing in case a annealing of III-V series compound substrate, e.g., GaAs, InP, etc. That is, in the infrared lamp annealing, re-distribution of the ion implanted impurity is effectively suppressed. Although in the furnace annealing, it is required to use a protection film as an insulation film, e.g., $SiO_2$, $Si_3N_4$, etc., it is not necessary to use such protection film in the infrared lamp annealing method because of the short annealing time.

As explained above, rapid thermal annealing (RTA) using radiation from infrared lamps (e.g. halogen lamps) is a very promising annealing method for compound semiconductor substrates, e.g., ion-implanted GaAs. The great advantages of this method are, as stated above, a short annealing time and its relative simplicity as compared with the conventional furnace annealing. The diffusion of implanted dopants and surface degradation of GaAs wafer due to As dissociation are expected to be suppressed by this short annealing time. In spite of those advantages, only a few papers have been reported so far (Badawl et al. 1984, Cummings et al. 1986) on the application of the RTA method to annealing large-size (2- or 3-inch diameter) GaAs wafers. This is probably because considerable crystallographic slips are induced during RTA. Therefore, in order to apply the RTA method to GaAs IC processing, not only must the aforementioned problem be overcome, but it is necessary to insure that the wafer be uniformly annealed.

SUMMARY OF THE INVENTION

The present invention, therefore, has as its principal object the provision of an improved infrared lamp annealing method for annealing a compound substrate which is capable of effectively suppressing the slip line generation of the substrate and imparting uniform annealing characteristics to large size diameter compound semiconductor substrates.

These and other objects are accomplished by an annealing method according to the present invention, which method uses a guard ring. The guard ring is formed of the same material as the semiconductor substrate.

In a specific embodiment, the thickness of the guard ring is 1.5 times more than that of the semiconductor substrate, and the internal diameter of the guard ring is less than the sum of 3 mm plus the diameter of the semiconductor substrate, and the width of the guard ring is more than 10 mm.

According to the present invention as described herein, the following benefits, among others, are obtained.

By use of an improved annealing method according to the present invention, the slip line generation of a compound semiconductor substrate is effectively suppressed and uniform annealing characteristics are obtained even in large size diameter wafers, e.g. for over two-inch diameter GaAs wafers.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

One embodiment method of the present invention is now explained with reference to the drawings. The embodiment method is applied for annealing a two-inch diameter GaAs wafer.

Figure 1:
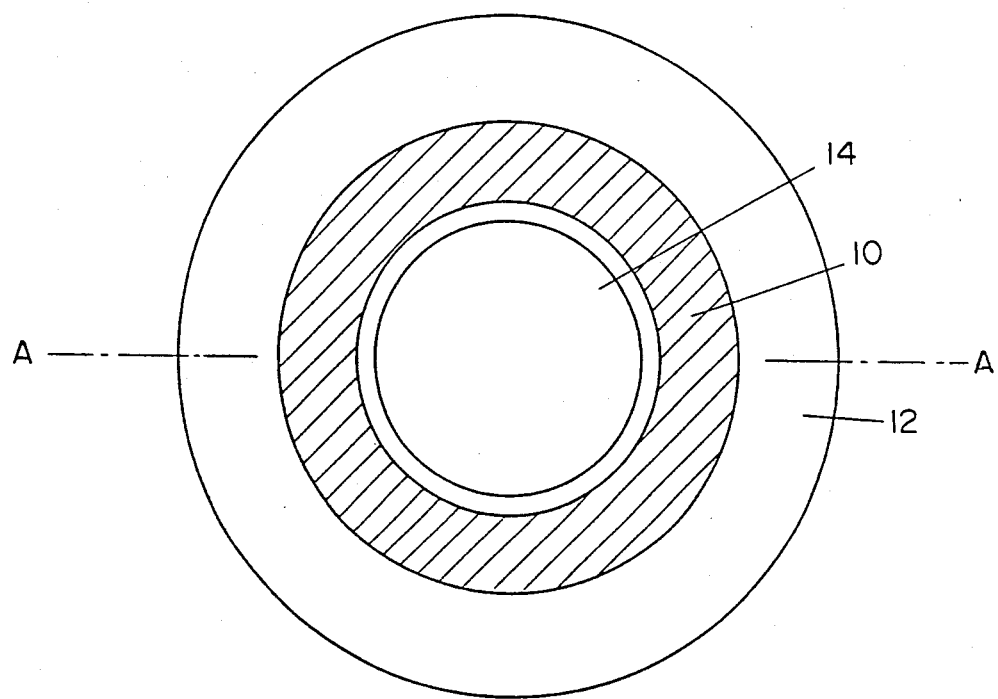
FIG. 1 is a plan view of a guard ring which is used in an annealing method as one embodiment of the invention.
Figure 2:
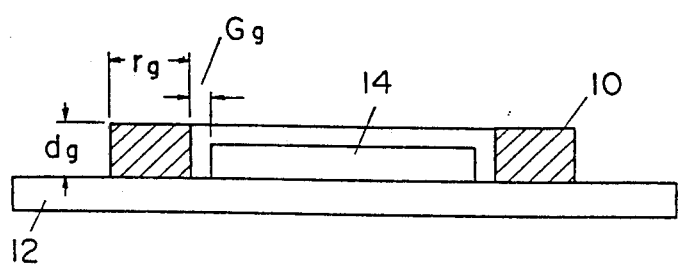
FIG. 2 is a section view taken along the line A—A' of FIG. 1.

In FIGS. 1 and 2, a guard ring 10 is formed concentrically on a silicon wafer 12. A two-inch diameter GaAs wafer 14 is disposed inside the guard ring 10 and on the silicon wafer 12. The guard ring 10 is formed by GaAs which is the same material as a GaAs wafer 14. The width of the guard ring 10 is defined as rg (=½ (external diameter of guard ring 10 — internal diameter thereof)), the thickness of guard ring 10 as dg, and the gap Gg between guard ring 10 and two-inch GaAs wafer 14.

Figure 5:
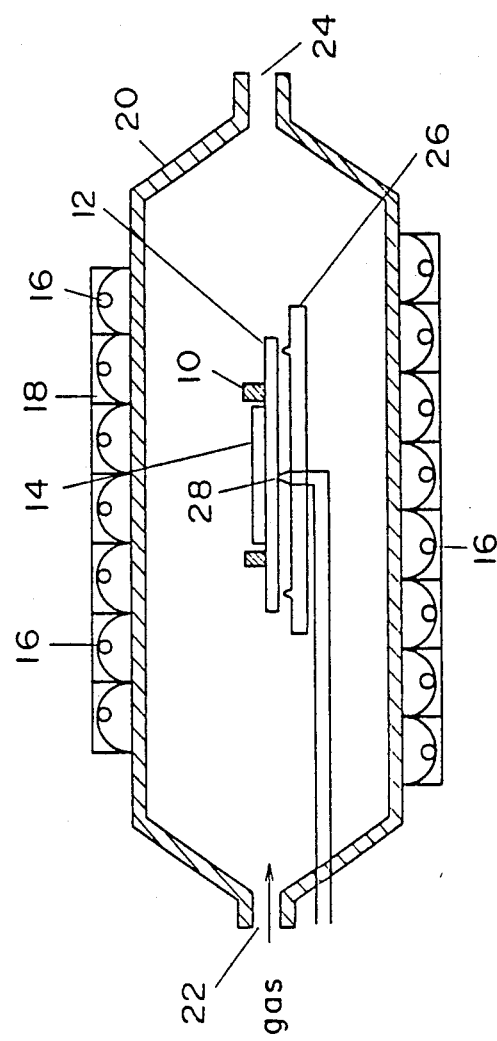
FIG. 5 is schematic illustration of an infrared lamp annealing apparatus which is used in the annealing embodiment of the present invention.

Then, annealing is carried out by use of the guard ring 10 in FIGS. 1 and 2 and an infrared lamp annealing apparatus shown in FIG. 5, to find the length of the slip lines which appear on the peripheral portion of the GaAs wafer 14. Gg and rg is changed to see the variation of the slip line length. The diameter of the guard ring 10 is 50 mm and the thickness thereof is 400 μm. The annealing condition is 900° C., 10 seconds. This condition is one which is generally used for activating an n-type active layer of a GaAs metal shottkey fixed affect transistor. In FIG. 5, infrared lamps (a tungsten lamp, a halogen lamp, etc.) 16 with a reflection plate 18 are disposed outside a quartz glass succeptor 20 which has a gas inlet 22 and a gas outlet 24. Wafer support table 26 is disposed fixedly inside succeptor 20. The silicon wafer 12 with the guard ring 10 on which GaAs wafer 14 is disposed is mounted on table 26. A thermocouple monitor is disposed on the silicon wafer 12 to detect the temperature of annealing.

Figure 3:
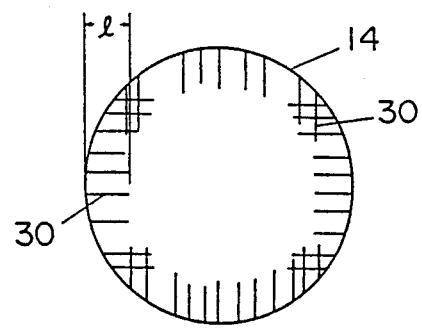
FIG. 3 is a plan view of a GaAs wafer which is used in the annealing method of the present invention.

In case that guard ring 10 is not provided, i.e., in conventional infrared lamp annealing, the temperature for thermal radiation on the GaAs wafer 14 is lower at the peripheral portion of the GaAs wafer 14 than at the central portion thereof, so that non-uniformity of temperature occurs on the wafer surface and many slip lines 30 appear on the peripheral portion of the GaAs wafer 14, as shown in FIG. 3.

Then, under the situation that guard ring 10 is provided with silicon wafer 10, and infrared lamp annealing is carried out to see whether slip lines are suppressed by the function of the guard ring 10. Annealing is carried out five times by changing the Gg and rd of guard ring as follows.

(i) Gg=2.0 mm, RG=10 mm
(ii) Gg=1.5 mm, RG=5 mm
(iii) Gg=1.5 mm, RG=7 mm
(iv) Gg=1.5 mm, RG=10 mm
(v) Gg=1.0 mm, RG=10 mm In each annealing, the length of slip line is measured by an X-ray topography technique.

Figure 4:
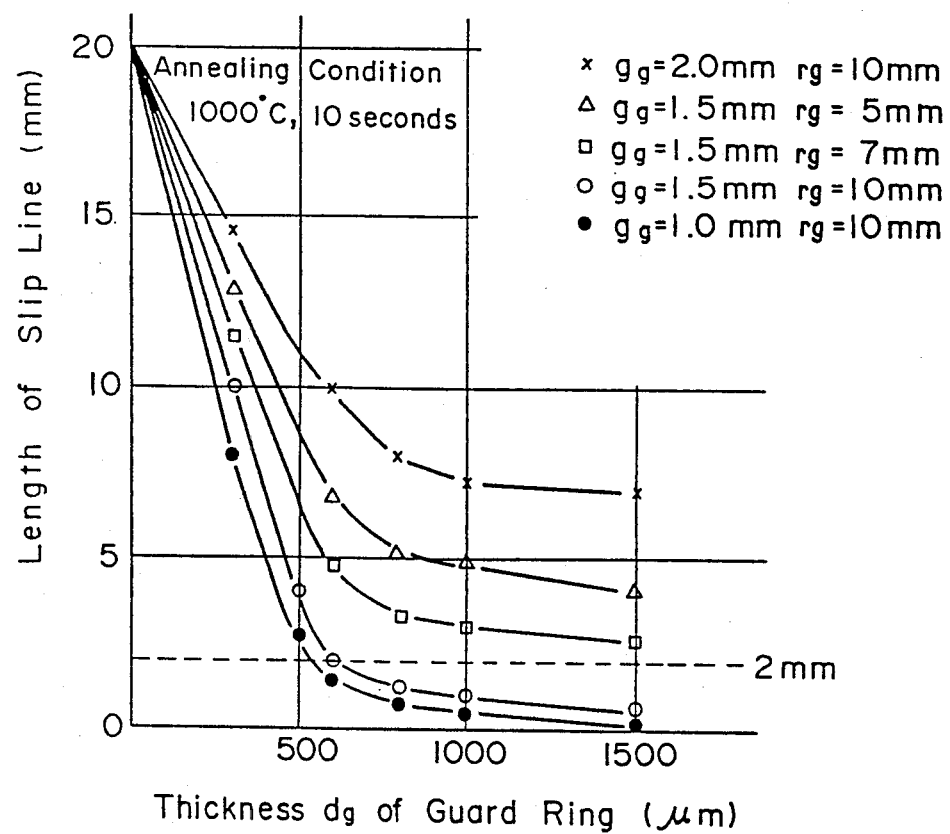
FIG. 4 is an illustration of the characteristics showing the relationship of length of slip lines and the shape of the guard ring.

FIG. 4 shows the result of the above-stated five annealings as length of guard lines vs. the thickness of guard ring.

As apparent from FIG. 4, there occurs no actual problem in case that Gd is less than 1.5 mm, dg is more than 600 $\mu$m and rg is more than 10 mm, thereby the length of the slip line becoming less than 2 mm. Considering that thickness of GaAs wafer 14 is 400 $\mu$m, preferable condition is that thickness of guard ring 10 is 1.5 times more than that of GaAs wafer 14, internal diameter of guard ring 10 is less than diameter of GaAs wafer 14 plus 3 mm and width of guard ring 10 is more than 10 mm. By use of the guard ring under the above-stated conditions, the temperature differences on a GaAs wafer 14 is suppressed so that occurrence of slip lines can be greatly suppressed.

Incidentally, it is expected that, in the case of long-time annealing, the thickness of GaAs guard ring may be more than 1.5 times thickness to obtain the advantages of slip line reduction.

The, next experiment will now be explained. The thermal annealing system used in this experiment was a commercial Heatpulse 210T system manufactured by A. G. Associates. The wafers 14 used in this work were undoped (100) semi-insulating 2-inch diameter GaAs crystals grown by a liquid encapsulated Czochralski (LEC) method. $Si^{29}$ and $Si^{28}$ were implanted selectively at 100 keV and 150 keV for n-type layers of FETs and n+-type layers of source/drain regions, respectively.

Figure 6:
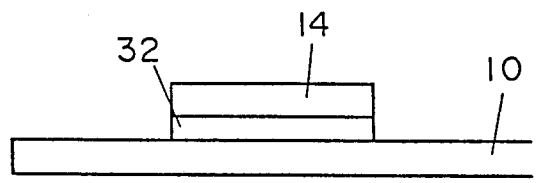
FIG. 6 shows experimental arrangements for different kinds of annealing.
Figure 6:
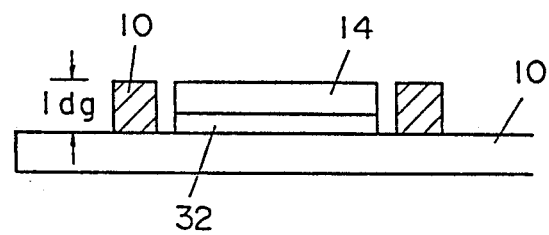
Figure 6:
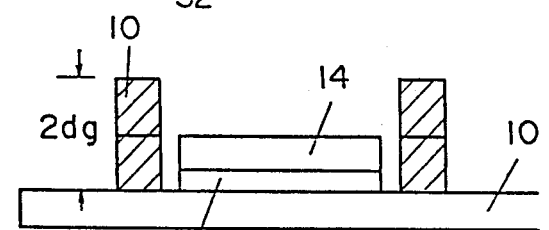
Figure 6:
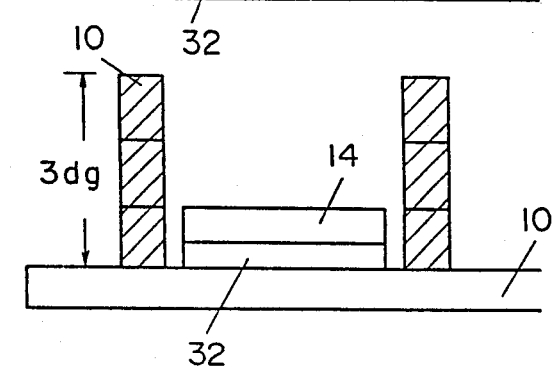

The wafers 14 were annealed caplessly using the proximity method (i.e., face down on another 2-inch diameter GaAs wafer 32) under an Ar atmosphere in order to prevent the surface degradation during thermal annealing. These GaAs wafers were supported by a 4-inch diameter Si wafer 10. Experimental arrangements A~D are shown in FIG. 6. In such experiments, A=no guard ring, B=guard ring with the same height of GaAs wafers 14+32; C=a guard ring with its height two times that of guard ring in B; and D=a guard ring with its height three times that of guard ring in B. The annealing temperature and time are 950° C. and 15 sec, respectively. GaAs guard ring was made from a 3-inch diameter GaAs wafer (800 $\mu$m-thickness).

Figures 7A, 7B:
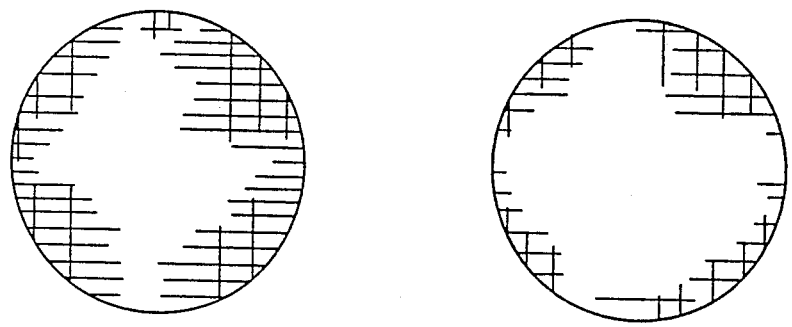
FIG. 7 shows X-ray transmission topographs for different kinds of annealing in FIG. 6.
Figures 7C, 7D:
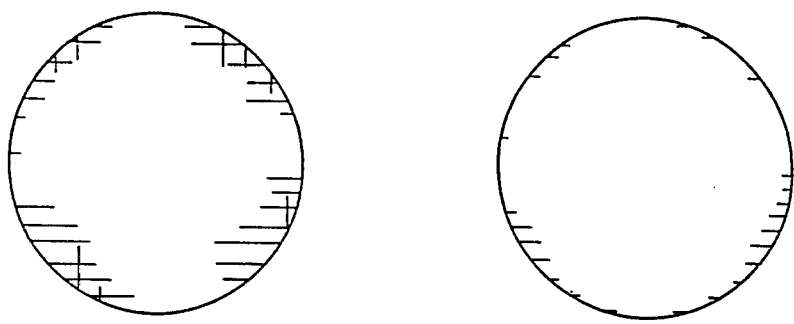

After annealing, the GaAs wafers 14 were examined by X-ray transmission topography using MoK$\alpha$ radiation. The results are shown in FIG. 7. An As-grown wafer without heat treatment is also shown as a reference. The method A, B, C and D resulted in the generation of extensive slip networks toward the center from the periphery of the wafer. A clear improvement in the reduction of slip lines is seen for the method D in which three GaAs guard rings were used. These results indicate that the uniformity of temperature distribution across the wafer is improved using three GaAs guard rings. Under the annealing condition of 950° C., 15 sec, it is necessary to provide a thickness of the GaAs guard ring three times more than that of the substrate to reduce slip lines.

In the following experiments thermal annealing method D was employed, using three GaAs guard rings.

The uniformity of the annealing characteristics and activation by thermal annealing were investigated as changing annealing temperature with the aim of its application to device fabrication. GaAs FETs have been fabricated on 2-inch diameter GaAs wafers $Si^{29}$ and $Si^{28}$ were selectively implanted at 100 keV with a dose of $5 \times 10^{12}$ cm$^{-2}$ and at 150 keV with a dose of $1 \times 10^{14}$ cm$^{-2}$ for active layers and source/drain regions of FETs, respectively. The source-drain spacing and channel width of FET are 3 $\mu$m and 5 $\mu$m, respectively. The uniformity of annealing characteristics was evaluated by drain saturation current (Idss) distribution of about 1100 gateless FETs, which were measured using a computer controlled automatic probing system by 1.2 mm-pitch over a 2-inch diameter wafer.

Figure 8:
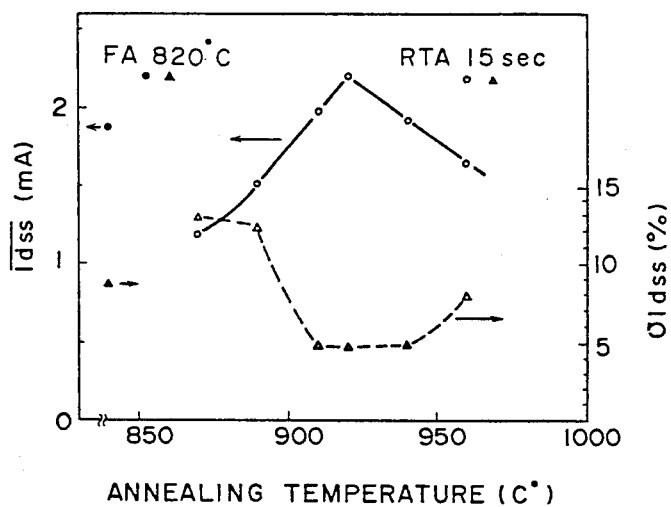
FIG. 8 shows the annealing temperature dependence of $\overline{Idss}$ and $\sigma$ Idss.

FIG. 8 shows the annealing temperature dependence of $\overline{Idss}$ (mean value of Idss) and $\sigma$Idss (standard deviation of Idss). The annealing time was 15 sec. As a reference, the result obtained by conventional furnace annealing (FA, capless annealing at 820° C. for 15 min in AsH$_3$/Ar atmosphere) was also shown in this figure. The $\overline{Idss}$ increases almost linearly with annealing temperature and has a maximum value at around 920° C. Over that temperature, the $\overline{Idss}$ decreases linearly due to the surface degradation or the increase of compensation ratio because of the amphoteric nature of Si. The $\sigma$Idss has a minimum value at around 920° C. The values of $\overline{Idss}$ and $\sigma$Idss at 920° C. show higher activation and more uniform annealing characteristics than those of furnace annealing.

Figure 9:
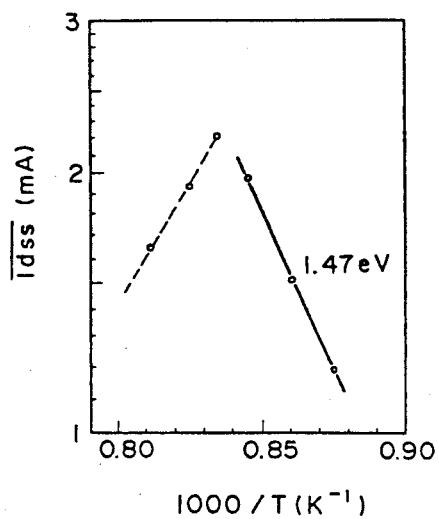
FIG. 9 shows the arrhenius plot of $\overline{Idss}$.

FIG. 9 shows the Arrhenius plot of $\overline{Idss}$. From this figure, the activation energy of 1.47 eV for $\overline{Idss}$ was obtained. That value is about three times higher than that reported in the case of high-dose ($>3 \times 10^{13}$ cm$^{-2}$) Si-implantation (Hiramoto et al. 1985, Cummings et al. 1986). The reason is not clear at present, but it may be due to the difference of the implanted dose.

Figure 10:
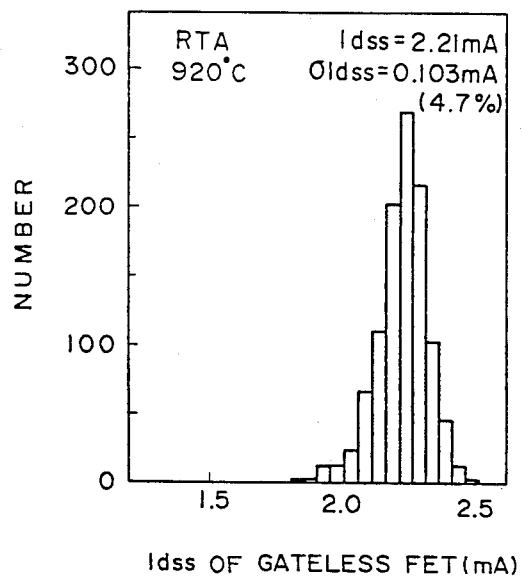
FIG. 10 shows the histogram of Idss for gateless FETs by annealing at 920° C. for 15 sec.

FIG. 10 show the histogram of Idss over a 2-inch diameter wafer by thermal annealing at 920° C.

From the above results, the annealing condition at 920° C. for 15 sec was selected as optimum, and this annealing condition was adopted for fabrication of GaAs digital ICs.

Figure 11:
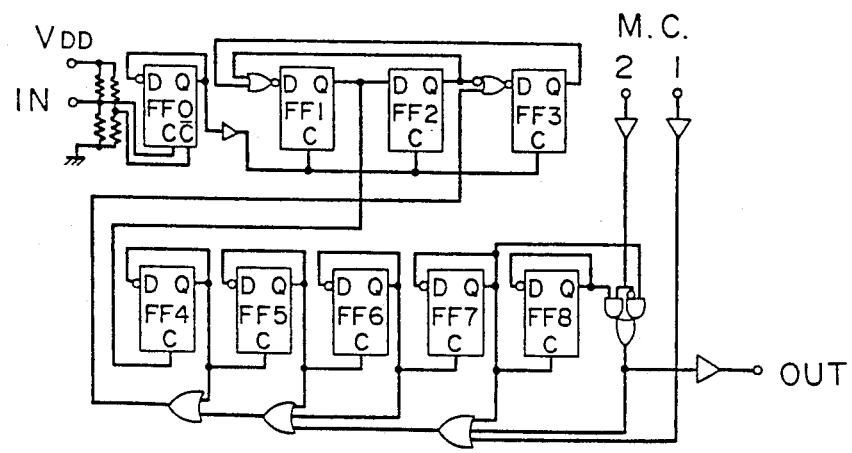
FIG. 11 is block diagram of prescaler IC.

Using the above-stated thermal annealing, GaAs digital ICs (dual-modulus prescaler) were fabricated on a 2-inch diameter GaAs wafer. FIG. 11 shows the block diagram of a fabricated dual-modulus prescaler IC for the use of mobile telecommunication systems designed to have a low dissipation current (Hasegawa et al. 1986). By the two mode control signals MC1 and MC2, it operates as a 256/258/128/130 variable frequency divider. This prescaler consists of 334 1 μm-gatelength enhancement-mode MESFETs (E-MESFETs), 56 load resistors and 104 shift diodes using source-coupled FET logic (SCFL) with a fully complementary operation (Katsu et al. 1982, Iida et al. 1985).

The $n^+$-type source/drain regions of FETs and n-type layers of FETs, load resistors and shift diodes were formed by selective $Si^{28}$ (150 keV, $1 \times 10^{-}cm^{-2}$) and $Si^{29}$ (100 keV, $\sim 4 \times 10^{12}$ cm$^{-2}$) ion implantations, respectively. The thermal annealing (method D) was carried out under optimum annealing conditions (920° C., 15 sec). The gate electrode was Pt/Ti/Au and the threshold voltage (Vth) of FET was adjusted to 0.1~0.2 V by sintering at 380° C. in an Ar atmosphere using a Pt buried gated technology (Onuma et al. 1983). The typical value of σVth (standard deviation of Vth) over a 2-inch diameter wafer was about 40~60 mV, of which value is lower than that of furnace annealing (60~80 mV), at Vth=0.1 V in the case of using conventional LEC crystals. The first and second interconnection lines were formed with about 2 μm-thick Ti/Pt/Au by a plating technique. 2 μm-thick polymide was formed as the cross-over insulator to reduce the interconnection capacitance.

The chip yield was as high as 69% for 1 GHz operation, which is higher than that of furnace annealing (typical 40~60%). The lowest dissipation current was 3.1 mA with a 5 V supply voltage for a 1 GHz operation. These results have proved that this thermal annealing method is very promising for GaAs digital IC processing.

A novel annealing method using GaAs guard rings has been explained. This method has shown to provide reduced slip line generation and uniform annealing characteristics over a 2-inch diameter GaAs wafer. using this method, high-yield fabrication of GaAs digital ICs has been achieved.

Incidentally, in the above embodiments, a GaAs wafer 14 and a GaAs guard ring 10 are used, but the same advantages can be obtained in other III-V series (e.g., InP), II-IV series (e.g., ZnSe, CdTe) compound semiconductor wafers and guard rings.

While the specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. An annealing method for GaAs wafer comprising;
   providing a GaAs guard ring on a GaAs wafer in such manner that said GaAs wafer is disposed inside said GaAs guard ring, said GaAs wafer being disposed face down on a GaAs base wafer which is disposed on said silicon wafer and wherein the thickness of said GaAs guard ring is three times more than that of said GaAs wafer plus GaAs base wafer; and
   applying infrared light on said GaAs wafer for annealing.

2. The annealing method of claim 1, wherein the thickness of said guard ring is 1.5 times more than that of said compound semiconductor substrate, and the internal diameter of said guard ring is less than the diameter of said compound semiconductor substrate plus 3 mm, and wherein the width of said guard ring is more than 10 mm.

3. An annealing method for a GaAs semiconductor substrate comprising:
   providing a GaAs guard ring in such manner that said GaAs guard ring surrounds said GaAs semiconductor substrate, and
   applying infrared light on said GaAs semiconductor substrate,
   wherein the thickness of said GaAs guard ring is 1.5 times more than that of said GaAs semiconductor substrate, and the internal diameter of said GaAs guard ring is less than the diameter of said GaAs semiconductor substrate plus 3 mm, and wherein the width of said GaAs guard ring is more than 10 mm.

* * * * *